United States Patent
Zhao et al.

(10) Patent No.: US 11,489,116 B2
(45) Date of Patent: Nov. 1, 2022

(54) THERMAL FIELD CONTROLLED ELECTRICAL CONDUCTIVITY CHANGE DEVICE

(71) Applicant: HEFEI RELIANCE MEMORY LIMITED, Hefei (CN)

(72) Inventors: Liang Zhao, Sunnyvale, CA (US); Zhichao Lu, San Jose, CA (US)

(73) Assignee: Hefei Reliance Memory Limited, Hefei (CN)

(*) Notice: Subject to any disclaimer, the term of this patent is extended or adjusted under 35 U.S.C. 154(b) by 171 days.

(21) Appl. No.: 16/789,955

(22) Filed: Feb. 13, 2020

(65) Prior Publication Data

US 2020/0274062 A1    Aug. 27, 2020

Related U.S. Application Data

(60) Provisional application No. 62/809,434, filed on Feb. 22, 2019.

(51) Int. Cl.
*H01L 45/00*   (2006.01)
*H01L 27/24*   (2006.01)

(52) U.S. Cl.
CPC ...... *H01L 45/1286* (2013.01); *H01L 27/2463* (2013.01); *H01L 45/1233* (2013.01); *H01L 45/1253* (2013.01); *H01L 45/146* (2013.01)

(58) Field of Classification Search
CPC ............ H01L 45/1286; H01L 45/1293; H01L 45/1233; H01L 27/2463
See application file for complete search history.

(56) References Cited

U.S. PATENT DOCUMENTS

| | | | |
|---|---|---|---|
| 6,653,704 B1 * | 11/2003 | Gurney | ................ H01L 27/224 257/E27.005 |
| 2011/0069533 A1 | 3/2011 | Kurosawa et al. | |
| 2013/0134382 A1 * | 5/2013 | Martens | ............... H01L 45/1233 257/5 |
| 2013/0207069 A1 | 8/2013 | Pickett et al. | |
| 2016/0225818 A1 | 8/2016 | Toh et al. | |
| 2018/0352611 A1 | 12/2018 | Kim et al. | |

OTHER PUBLICATIONS

PCT International Search Report and the Written Opinion dated Apr. 28, 2020, issued in related International Application No. PCT/US2020/018083 (10 pages).

* cited by examiner

*Primary Examiner* — Mark V Prenty
(74) *Attorney, Agent, or Firm* — Sheppard Mullin Richter & Hampton LLP

(57) ABSTRACT

Thermal field controlled electrical conductivity change devices and applications therefore are provided. In some embodiments, a thermal switch, comprises: a metal-insulator-transition (MIT) material; first and second terminals electrically coupled to the MIT material; and a heater disposed near the MIT material.

10 Claims, 13 Drawing Sheets

THERMAL FIELD CONTROLLED ELECTRICAL CONDUCTIVITY CHANGE DEVICE

CROSS REFERENCE TO RELATED APPLICATIONS

The present application claims priority to U.S. Provisional Patent Application No. 62/809,434, filed Feb. 22, 2019, entitled "THERMAL FIELD CONTROLLED ELECTRICAL CONDUCTIVITY CHANGE DEVICE," the disclosure thereof incorporated by reference herein in its entirety.

TECHNICAL FIELD

The disclosure relates generally to computer technology, and particularly, to switching elements for computer systems.

BACKGROUND

Some materials exhibit two electrically-conductive states. In one state the material has the electrically-conductive properties of a metal, while in the other state the material has the electrically-conductive properties of an insulator. Accordingly, this class of materials is referred to as metal-insulator-transition (MIT) materials. These MIT materials are the subject of intense research and development to discover practical applications.

SUMMARY

In general, one aspect disclosed features a thermal switch, comprising: an MIT material; first and second terminals electrically coupled to the MIT material; and a heater disposed near the MIT material.

Embodiments of the thermal switch may include one or more of the following features. Some embodiments comprise an electrical insulator disposed between the MIT material and the heater. In some embodiments, the heater comprises: a Joule heater. Some embodiments comprise third and fourth terminals electrically coupled to the heater; wherein the Joule heater generates heat when a current is passed through the Joule heater and the third and fourth terminals. In some embodiments, the Joule heater comprises at least one of: a constriction in a nanowire; or a nanopore in a nanowire. In some embodiments, states of the MIT material may be sensed at the first and second terminals, wherein the states comprise a metal state and an insulator state. In some embodiments, states of the MIT material may be changed at the first and second terminals, wherein the states comprise a metal state and an insulator state.

In general, one aspect disclosed features a memory device comprising: a memory; and a memory selector electrically coupled to the memory, wherein the memory selector comprises: an MIT material, and a heater disposed near the MIT material.

Embodiments of the memory device may include one or more of the following features. Some embodiments comprise an electrical insulator disposed between the MIT material and the heater. In some embodiments, the heater comprises: a Joule heater. In some embodiments, the Joule heater comprises at least one of: a constriction in a nanowire; or a nanopore in a nanowire. Some embodiments comprise first and second terminals electrically coupled to the heater; wherein the Joule heater generates heat when a current is passed through the Joule heater and the first and second terminals. Some embodiments comprise a first terminal electrically coupled to the MIT material; and a second terminal electrically coupled to the memory; wherein states of the MIT material may be changed at the first and second terminals, wherein the states of the MIT material comprise a metal state and an insulator state; and states of the memory may be changed and sensed at the first and second terminals. Some embodiments comprise an electrical insulator disposed between the heater and the first terminal. Some embodiments comprise one or more electrical insulators disposed between the heater and at least one of the MIT material, the memory, the first terminal, or the second terminal.

In general, one aspect disclosed features a cross-point memory array, comprising: an array of memory elements arranged in rows and columns, wherein each memory element comprises: a memory, and a memory selector electrically coupled to the memory, wherein the memory selector comprises: an MIT material, and a Joule heater disposed near the MIT material; a plurality of first metal lines each electrically coupled to memories of memory elements in a respective column; and a plurality of second metal lines each electrically coupled to memories of memory elements in a respective row.

Embodiments of the cross-point memory array may include one or more of the following features. Some embodiments comprise a plurality of thermal isolators disposed between the memory elements. In some embodiments, each of the memory elements further comprises: an electrical insulator disposed between the Joule heater and the respective second metal line. In some embodiments, each of the memory elements further comprises: one or more electrical insulators disposed between the Joule heater and at least one of the MIT material, the memory, the respective first metal line, or the respective second metal line. In some embodiments, each of the Joule heaters comprises at least one of: a constriction in a nanowire; or a nanopore in a nanowire.

BRIEF DESCRIPTION OF THE DRAWINGS

The accompanying drawings, which constitute a part of this disclosure, illustrate several non-limiting embodiments and, together with the description, serve to explain the disclosed principles.

DETAILED DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention.

Thermal control is a hot area for research and development in semiconductor devices and other devices. In some applications, it is desirable to operate different devices, and different portions of different devices, at different temperatures, even if the devices share a wafer or the like. The inventor has realized that certain physical effects may be employed to solve this problem.

Figure 1:
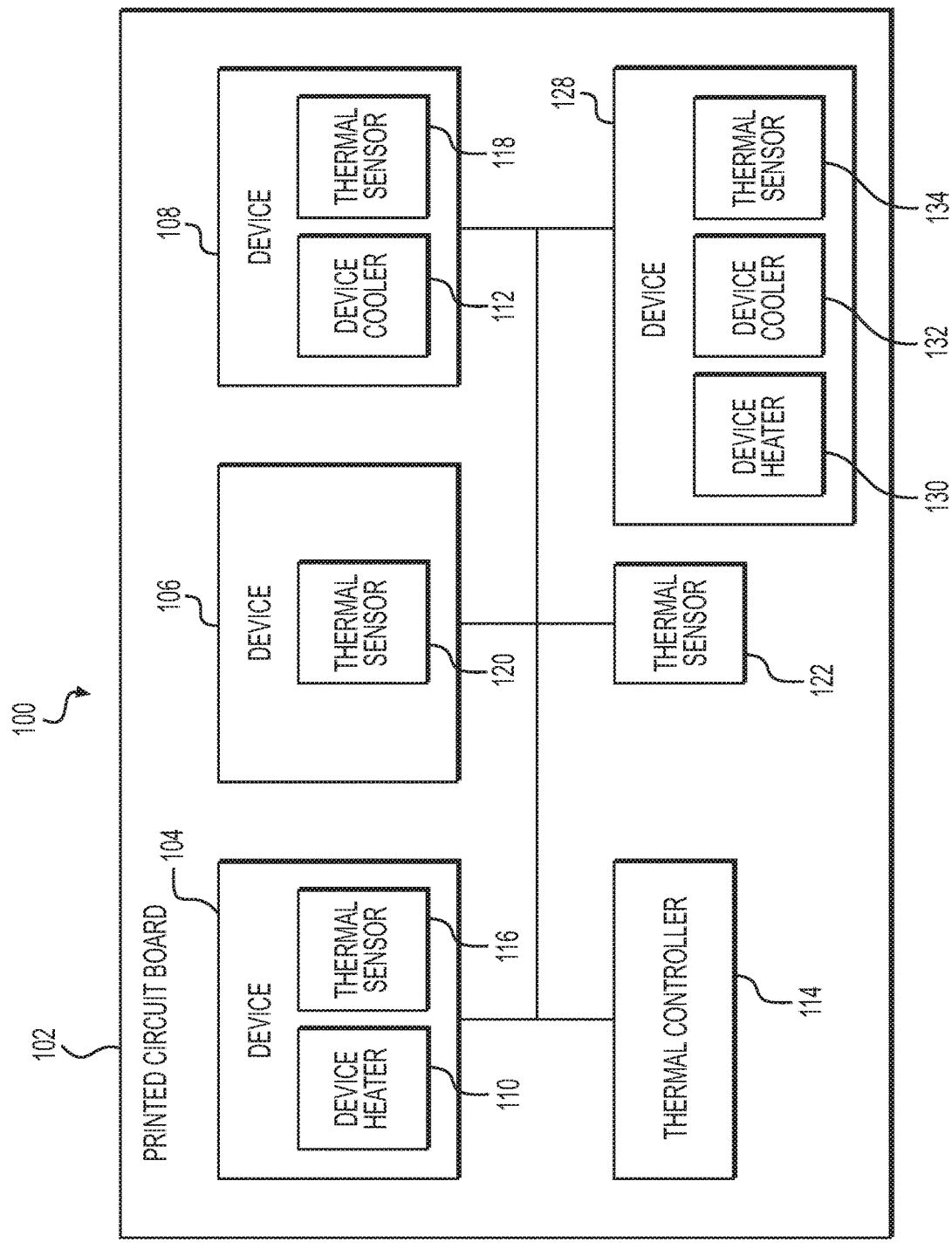
FIG. 1 illustrates an assembly having devices with device heaters and device coolers according to one embodiment of the disclosed technology.

FIG. 1 illustrates an assembly having devices with device heaters and device coolers according to one embodiment of the disclosed technology. Referring to FIG. 1, an assembly 100 may include a circuit board, wafer, or the like 102 and devices 104, 106, and 108. The devices 104, 106, and 108 may be implemented as any device, for example such as integrated circuits, transistors, non-volatile memory devices, other devices that may be included in integrated circuits, and the like. In some embodiments, the non-volatile memory devices may include resistive random access memory devices, phase-change memory devices, spin-transfer torque magnetic random-access memory devices, and the like.

In the example of FIG. 1, the devices 104, 106, and 108 may have different thermal requirements. In this example, it is desirable for the device 106 to operate at ambient temperature, the device 104 to operate above ambient temperature, and the device 108 to operate below ambient temperature.

In order to control the operating temperature of each device without affecting the operating temperatures of neighboring devices, thermal control devices may be implemented within each device. In the example of FIG. 1, a device heater 110 may be implemented within the device 104, and a device cooler 112 may be implemented within the device 108. In some embodiments, the device heater 110 is implemented as a Joule heater. A Joule heater is a device that generates heat when electric current is passed through the device. In other embodiments, the device heater 110 may be implemented using other physical effects. For example, other device heaters may employ the Peltier effect, photonic effects, plasmonic heat transfer, or any other effect that can transfer or deliver heat to the device 104. Different heating effects may be used alone or in combination.

The device cooler 112 may be implemented in a complementary manner. For example, the device cooler may be implemented as a thermoelectric cooler based on the Peltier effect. In some embodiments, micro fluid pipes may be used to circulate cooling liquid through the device 112. Different cooling effects may be used alone or in combination.

The assembly 100 may include a thermal controller 114 to control the device heater 110, and the device cooler 112. The thermal controller 114 may be implemented as a processor or the like. In some embodiments, the thermal controller 114 may be implemented externally to the assembly 100.

In some embodiments, the heated and cooled devices may include thermal sensors. In the example of FIG. 1, the heated device 110 may include a thermal sensor 116, and the cooled device 112 may include a thermal sensor 118. The thermal sensors 116, 118 may sense the temperatures of the devices 104, 108, and may provide this information to the thermal controller 114. In some embodiments, thermal sensors may be located elsewhere in the assembly 100. In the example of FIG. 1, a thermal sensor 120 is located in the device 106, and a thermal sensor 122 is disposed upon the wafer 102. The thermal controller 114 may employ this information to control the device heater 110, and the device cooler 112.

In some embodiments, it may be desirable to operate different regions of a single device at different temperatures. In such embodiments, a single device may include a device cooler and a device heater. Referring again to FIG. 1, the assembly 100 includes a device 128 that includes a device heater 130, a device cooler 132, and one or more thermal sensors 134. These elements may operate under the control of the thermal controller 114 as described above.

As mentioned above, a class of materials referred to as metal-insulator-transition (MIT) materials possesses two electrically-conductive states: a metal state and an insulator state. This transition may be controlled using an electrical field. The electrical control of MIT materials transitions has been studied, for example for use in selector applications in cross-point memory arrays. However, due to the nature of the electrically-induced transition, there is a trade-off between the threshold voltage and leakage current, making the selector characteristics less than ideal for mass-storage applications. Moreover, the coupling between electrical and thermal effects causes reliability degradation. Current overshoot after selector turn-on may generate increasing numbers of defects. That is, the defects generate heat, which generates more defects. Furthermore, the coupling of current and voltage between selector and memory devices makes it difficult to design accurate control circuitry. For example, the variability in distributions of defects in the devices causes turn-on voltages to vary widely among different devices.

Figure 2:
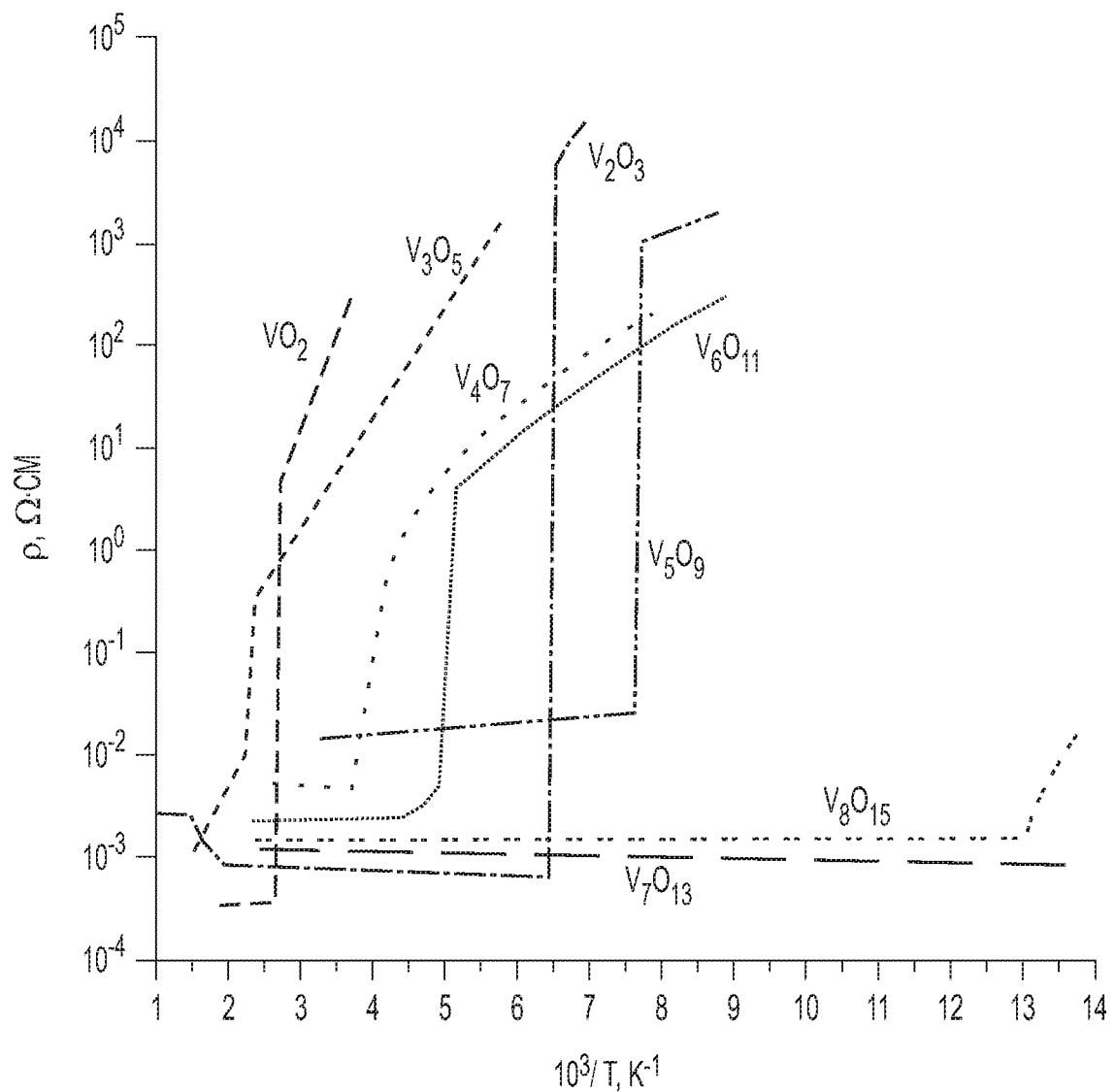
FIG. 2 illustrates metal-insulator transitions as a function of temperature for several vanadium oxides.
Figure 3:
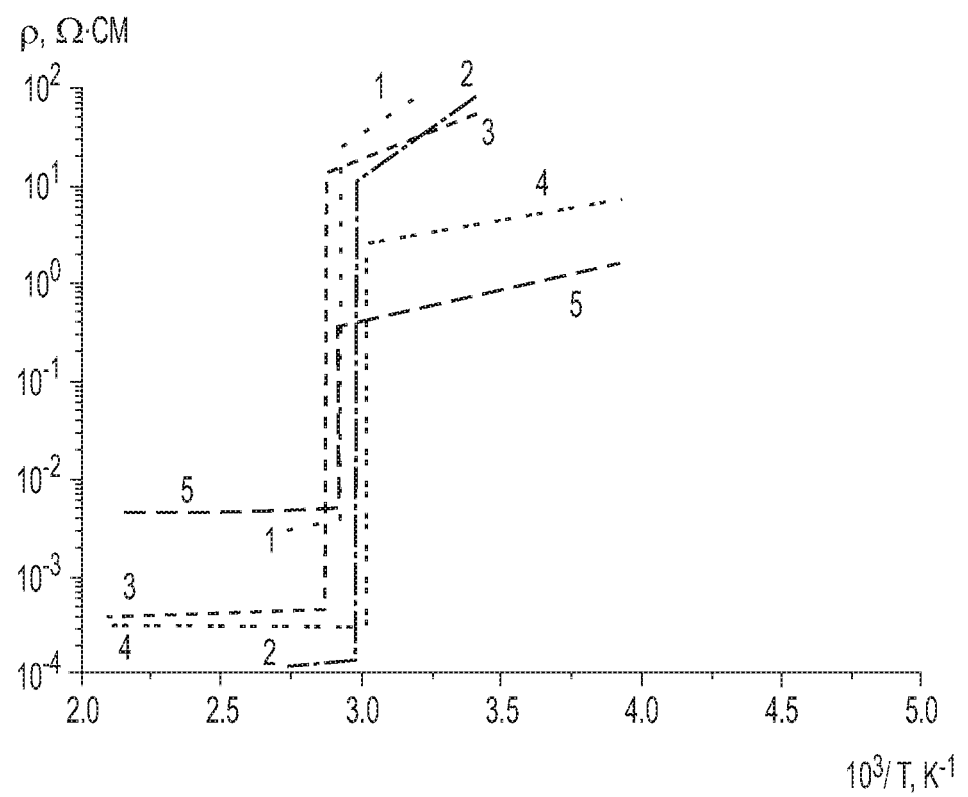
FIG. 3 illustrates resistivity of several VO2 single crystals along the c-axis as a function of reciprocal temperature.

For some MIT materials, the transition between the metal and insulator states may be controlled using a thermal field. One such class of materials is the vanadium oxides. FIG. 2 illustrates the metal-insulator transitions as a function of temperature for several vanadium oxides. FIG. 3 illustrates the resistivity of several $VO_2$ single crystals along the c-axis as a function of reciprocal temperature. Among vanadium oxides, $VO_2$ in particular shows a thermally-driven metal-insulator transition at approximately 67 C (340K). As can be seen in FIGS. 2 and 3, the resistivity of the vanadium oxides is reduced by several orders of magnitude at the transition (typically a $10^3$-$10^5$ change), accompanied by changes of other properties, including crystalline structure, photo-absorption, reflectance, etc.

Figure 4:
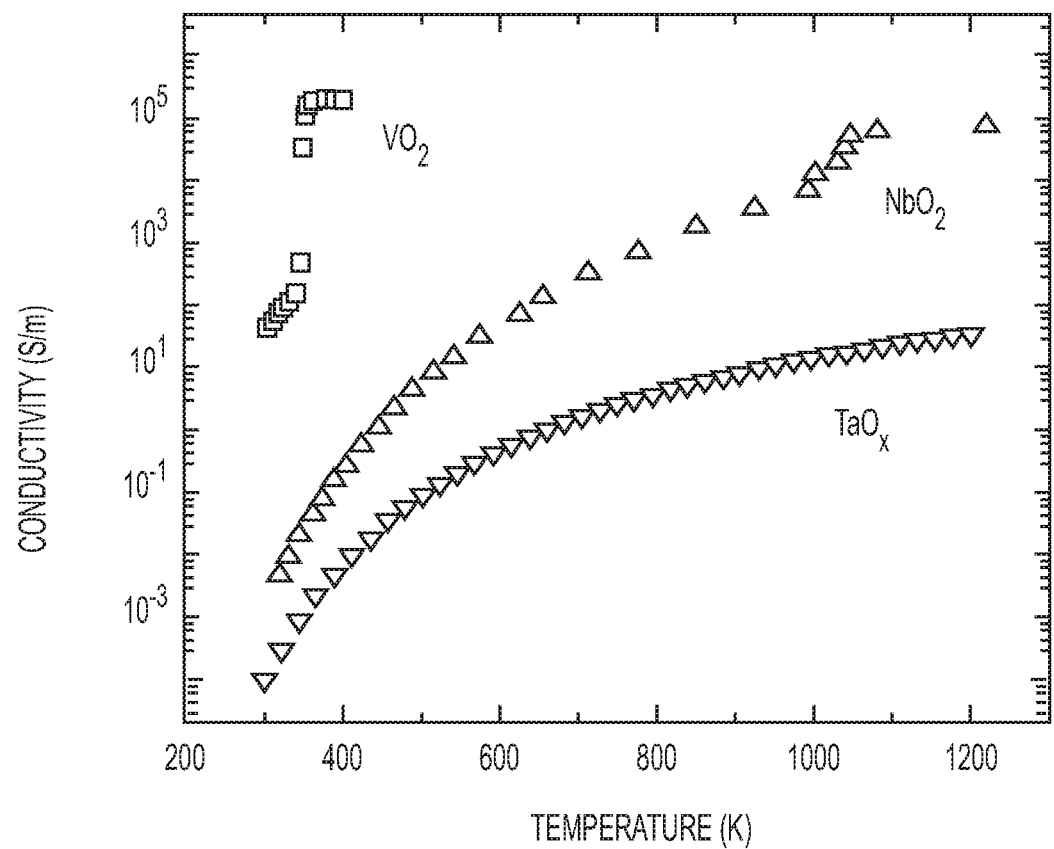
FIG. 4 illustrates the low field electrical conductivity of VO2, and $NbO_2$ as a function of temperature (and TaOx as a comparison which does not show MIT).
Figure 5:
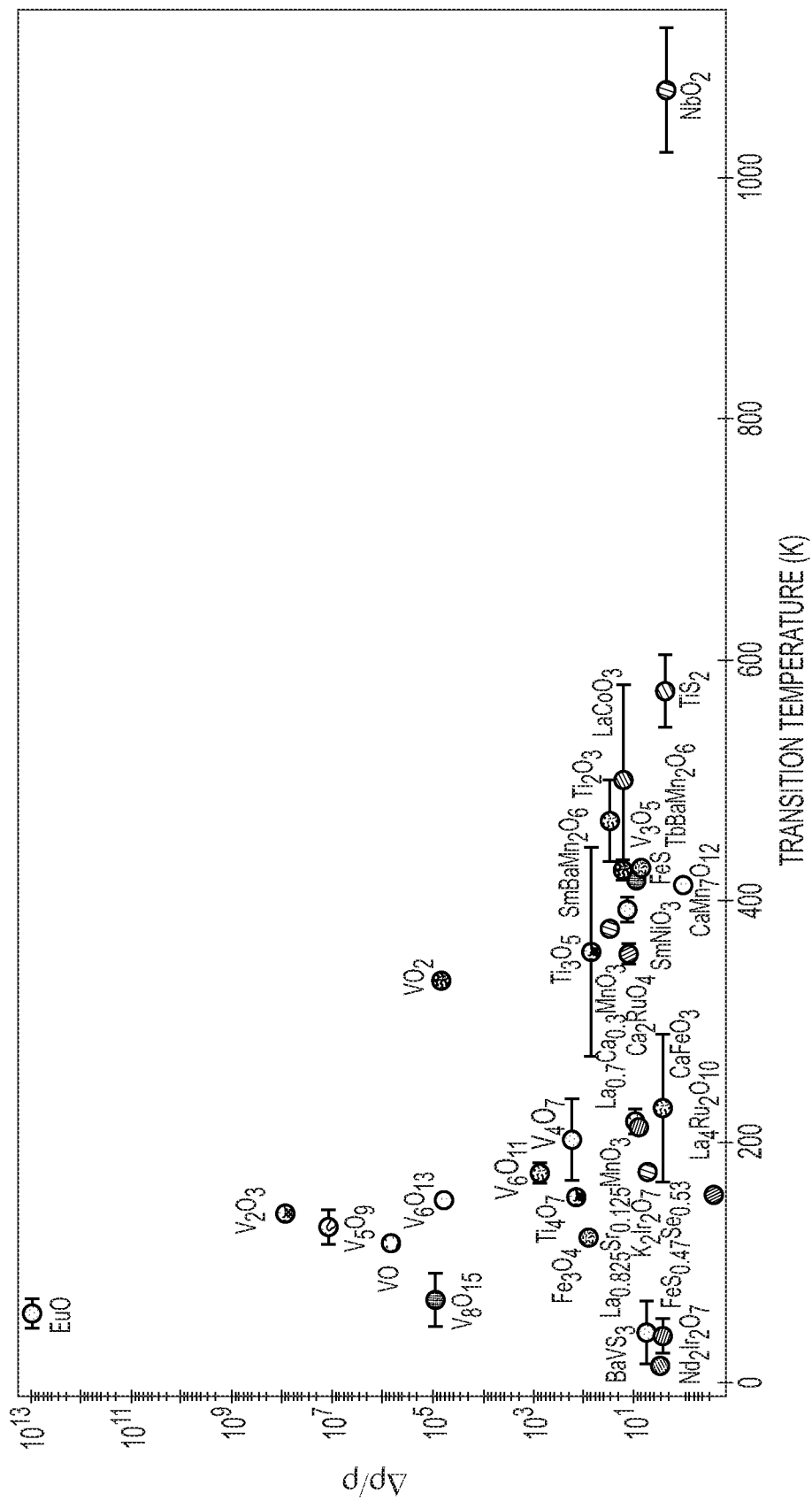
FIG. 5 illustrates electrical resistivity as a function of temperature for a number of common MIT materials.

Another class of MIT materials that exhibit a thermally-controlled transition are the niobium oxides. FIG. 4 illustrates the low field electrical conductivity of $VO_2$, and $NbO_2$ as a function of temperature (and $TaO_x$ as a comparison which does not show MIT). As can be seen from FIG. 4, $NbO_2$ shows a thermally-driven metal-insulator transition approximately 807 C (1080K). And even below this temperature, $NbO_2$ shows a resistivity change of more than six orders of magnitude from 300K to 1000K. FIG. 5 illustrates electrical resistivity as a function of temperature for a number of common MIT materials.

The inventor has realized that this thermally-driven metal-insulator transition can be utilized to implement a thermal switch, for example for use in integrated circuits. According to various embodiments, MIT materials are combined with on-chip heating elements, for example such as Joule-heat elements, to create a new type of thermal switch. Various embodiments of these switches exhibit a fast ramp-up time, for example on the order of a few nanoseconds. Various embodiments also exhibit precise temperature control and low-power operation through localized heating.

Furthermore, many existing semiconductor devices, including transistors, memristors, phase change memories, and the like, show different behaviors at different temperatures. The on-chip Joule-heat elements, in addition to controlling the thermal switches, can be used to control properties of these semiconductor devices as well. The disclosed thermal switches and on-chip heaters can be applied in a wide range of applications including computing, memory, power management, photonic circuits, and the like.

Figure 6:
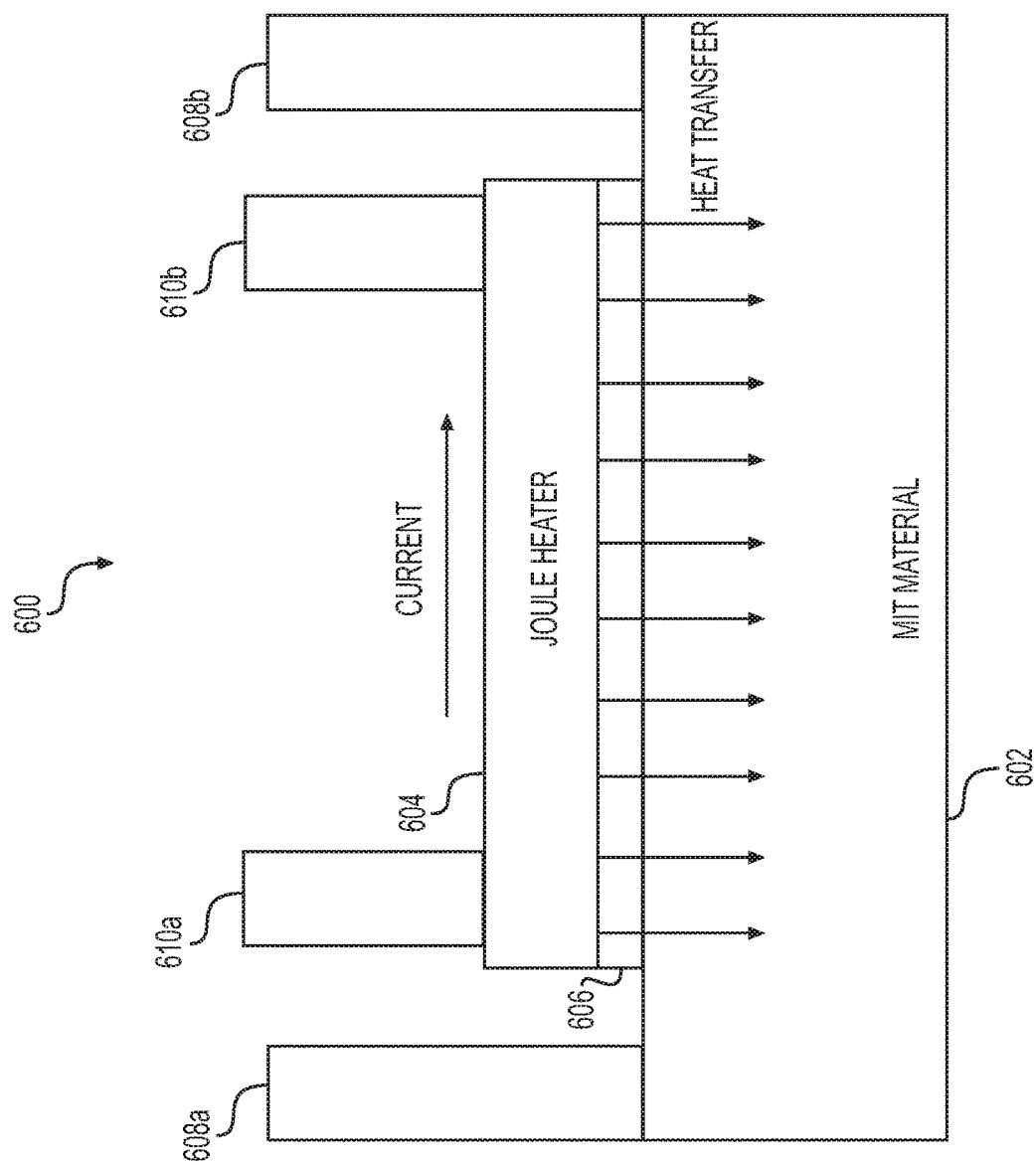
FIG. 6 illustrates a thermal switch according to one embodiment.

Several thermal switches according to various embodiments are now described. FIG. 6 illustrates a thermal switch according to one embodiment. Referring to FIG. 6, the thermal switch 600 includes an MIT material 602. The MIT material 602 may be any MIT material that exhibits a thermally-driven conductivity change, or combinations of those materials. For example, the MIT material 602 may be fabricated from $VO_2$, and $NbO_2$, or combinations thereof. Switch terminals 608a,b are electrically coupled to opposite ends of the MIT material 602 so that changes in the conductivity of the MIT material 602 may be sensed at those switch terminals 608.

A Joule heater 604 is disposed near the MIT material, between two electrical terminals 610a,b. The Joule heater 604 may be fabricated from any material that experiences a rise in temperature responsive to the passage of electrical current through the material. An isolator 606 is disposed between the Joule heater 604 and the MIT material 602. The isolator 606 is fabricated from a material that permits heat transfer from the Joule heater 604 to the MIT material 602, while acting as an electrical insulator between the Joule heater 604 and the MIT material 602. In some other embodiments, the isolator 606 is not necessary and can be removed. When the terminals 610a,b are used to pass current through the Joule heater 604, the temperature of Joule heater 604 rises, heating the MIT material 602. When the temperature of the MIT material 602 reaches its transition temperature, the conductivity of the MIT material 602 changes. This conductivity change may be sensed at the terminals 608a,b. The terminals 608a,b may also be used to sense changes in other physical properties of the MIT material 602, for example such as reflectance and the like.

Figure 7:
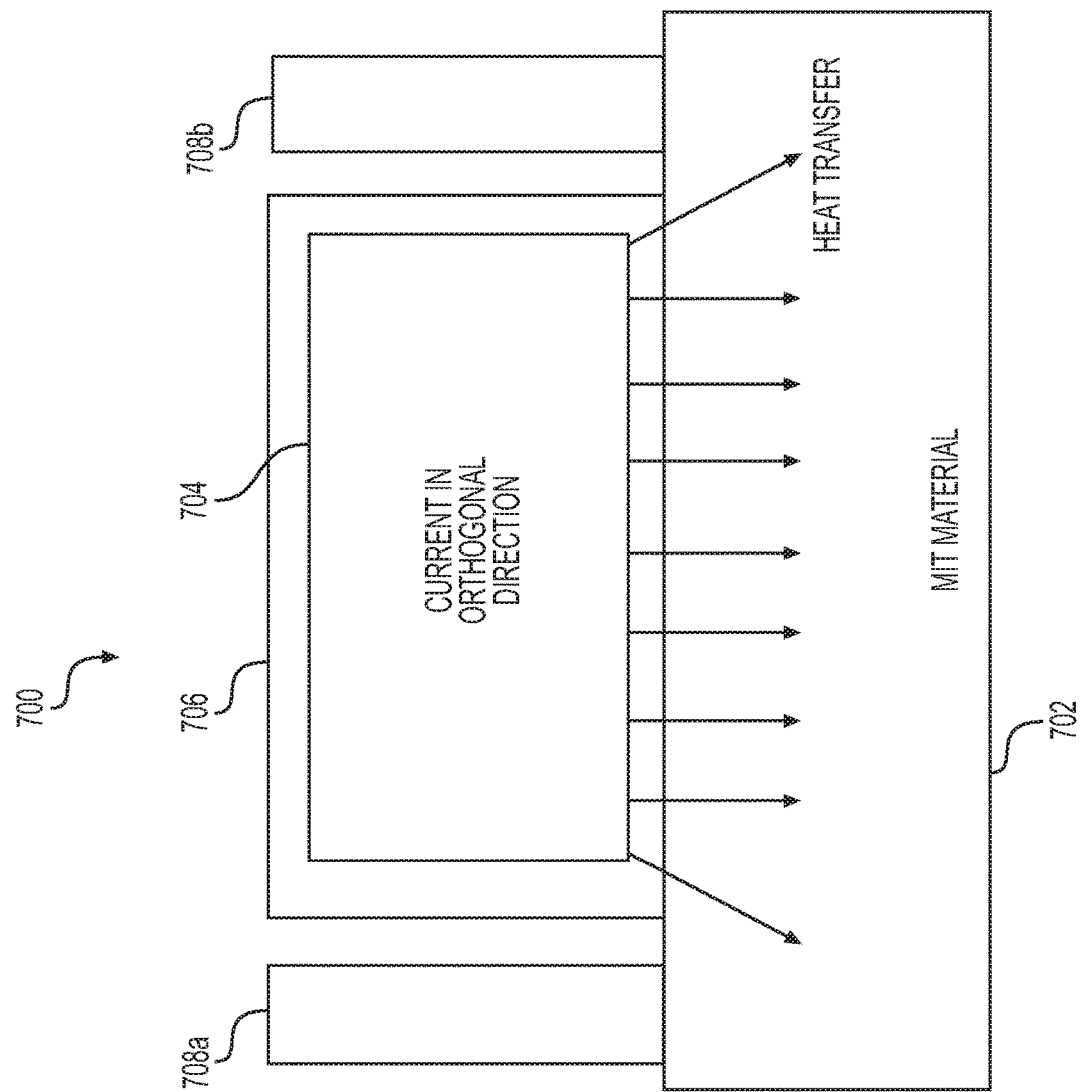
FIG. 7 illustrates a thermal switch according to another embodiment.

FIG. 7 illustrates a thermal switch according to another embodiment. Referring to FIG. 7, the thermal switch 700 includes a pair of electrical terminals 708a,b, and a Joule heater 704 encased in an isolator 706 that is disposed near an MIT material 702. These elements may be fabricated as described above. In the thermal switch 700 of FIG. 7, responsive to the passage of current through the Joule heater 704 in a direction orthogonal to the plane of the drawing, the temperature of the Joule heater 704 rises, heating the MIT material 702. The direction of the current flowing through the Joule heaters of the described embodiments may be arbitrary, as long as the current causes the Joule heater to heat the MIT material to its conductivity transition temperature. When the temperature of the MIT material 702 reaches its transition temperature, the conductivity of the MIT material 702 changes. This conductivity change may be sensed at the terminals 708a,b. The terminals 708a,b may also be used to sense changes in other physical properties of the MIT material 702 for example such as reflectance and the like.

Figure 8:
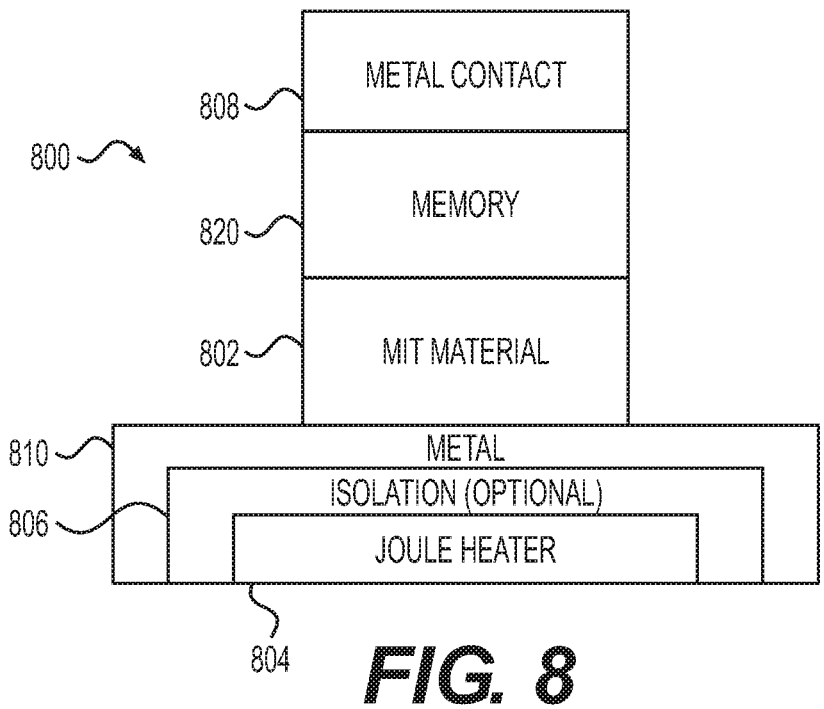
FIG. 8 illustrates a memory element for a cross-point memory array according to one embodiment.

The disclosed thermal switches may be used to implement cross-point memory arrays. Several such cross-point memory arrays are now described. FIG. 8 illustrates a memory element for a cross-point memory array according to one embodiment. Referring to FIG. 8, the memory element 800 includes a memory 820 near a MIT material 802. A metal contact 808 is disposed near the memory 820. A metal line 810 is disposed near the MIT material 802. A Joule heater 804 is disposed within the metal line 810, and can be separated from the metal line 810 by adding an isolator 806. The isolator 806 is optional and not necessary. If the isolator 806 is removed, then the heater 804 and the metal line 810 can be combined by using the same piece of metal line. The memory 820 may be fabricated as a transistor, memristor, phase change memory, or the like. The remaining elements may be fabricated as described above.

In operation, the MIT material 802, responsive to heat generated by the Joule heater 804, acts as a selector for the memory 820. In particular, changing the conductivity of the MIT material 802 using the Joule heater 804 can be used to sense or change the state of the memory 820. In this manner, the disclosed thermal switches may be used to perform memory selection operations for the memory array, for example during read operations, write operations, and the like.

Figure 9:
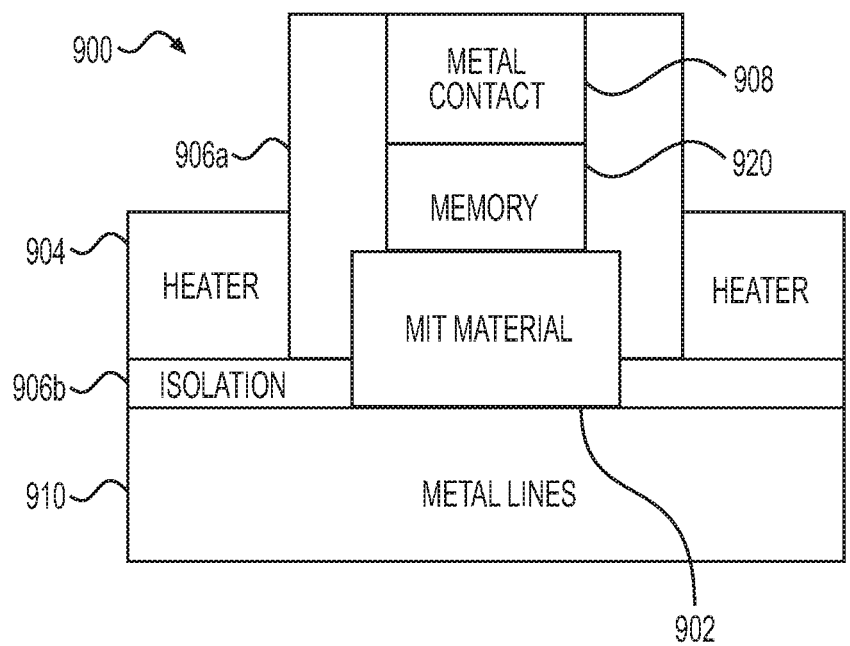
FIG. 9 illustrates a memory element for a cross-point memory array according to another embodiment.

FIG. 9 illustrates a memory element for a cross-point memory array according to another embodiment. Referring to FIG. 9, the memory element 900 includes a memory 920 near a MIT material 902. A metal contact 908 is disposed near the memory 920. A metal line 910 is disposed near the MIT material 902. A Joule heater 904 surrounds the memory 920, and the MIT material 902, but is separated from those elements by an isolator 906a. The Joule heater 904 is isolated from the metal line 910 by another isolator 906b. The elements of the memory element 900 may be a fabricated as described above.

In operation, the MIT material 902, responsive to the heat generated by the Joule heater 904, acts as a selector for the memory 920. In particular, changing the conductivity of the MIT material 902 using the Joule heater 904 can be used to sense or change the state of the memory 920.

Figure 10:
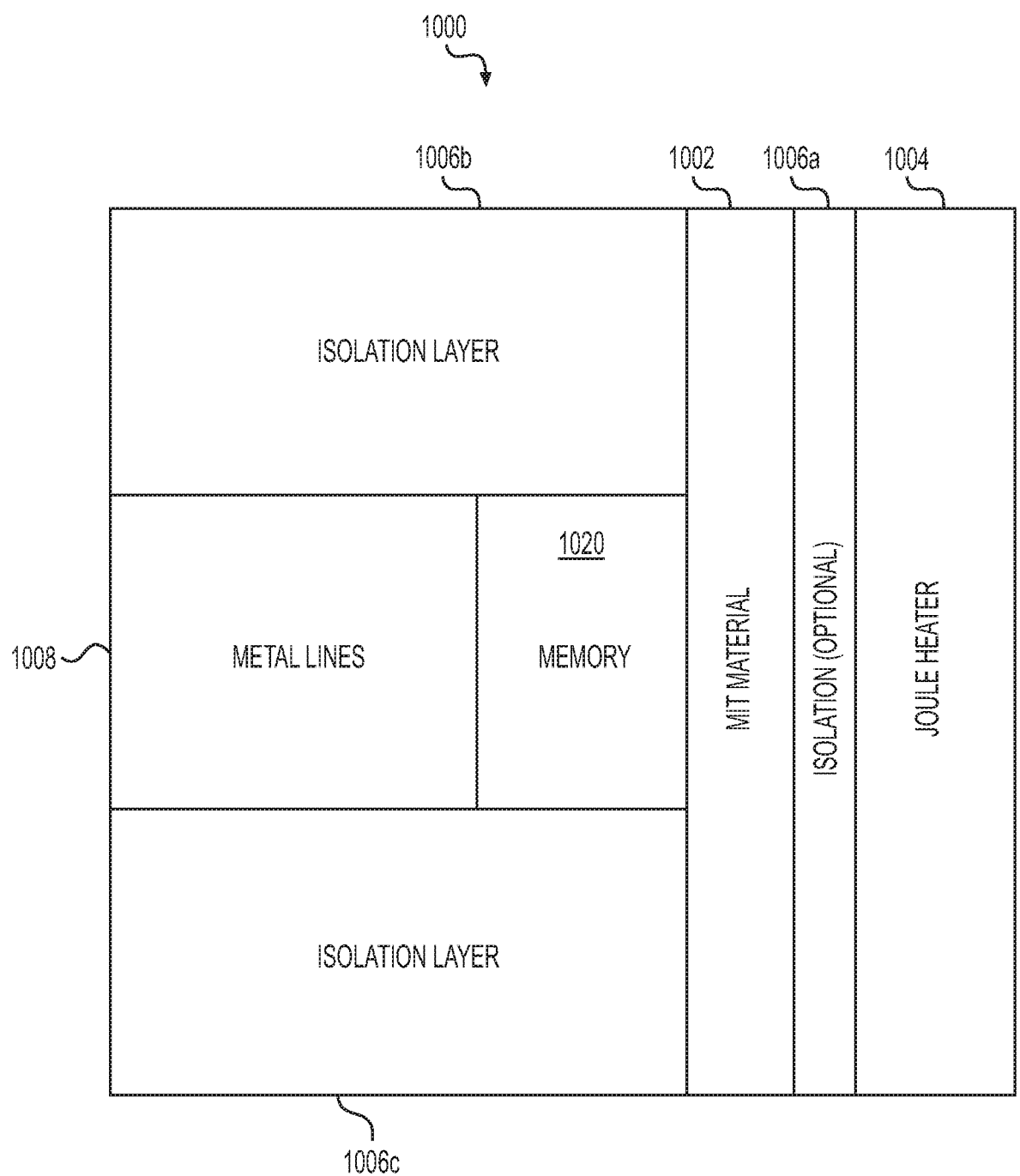
FIG. 10 illustrates a memory element for a 3D vertical memory array according to one embodiment.

FIG. 10 illustrates a memory element for a 3D vertical memory array according to one embodiment. Referring to FIG. 10, the memory element 1000 includes an MIT material 1002 separated from a Joule heater 1004 by an insulator 1006a. A memory 1020 is disposed between the MIT material 1002 and metal line 1008. The metal line 1008, and the memory 1020, are separated from adjacent metal lines and memories by isolators 1006b,c. Among the isolators, isolator 1006a is not necessary and can be removed or omitted. These elements may be fabricated as described above. When included in a 3D vertical memory array, the MIT material 1002 may act as a vertical electrode.

In operation, the MIT material 1002, responsive to the heat generated by the Joule heater 1004, acts as a selector for the memory 1020. In particular, changing the conductivity of the MIT material 1002 using the Joule heater 1004 can be used to sense and change the state of the memory.

Figure 11:
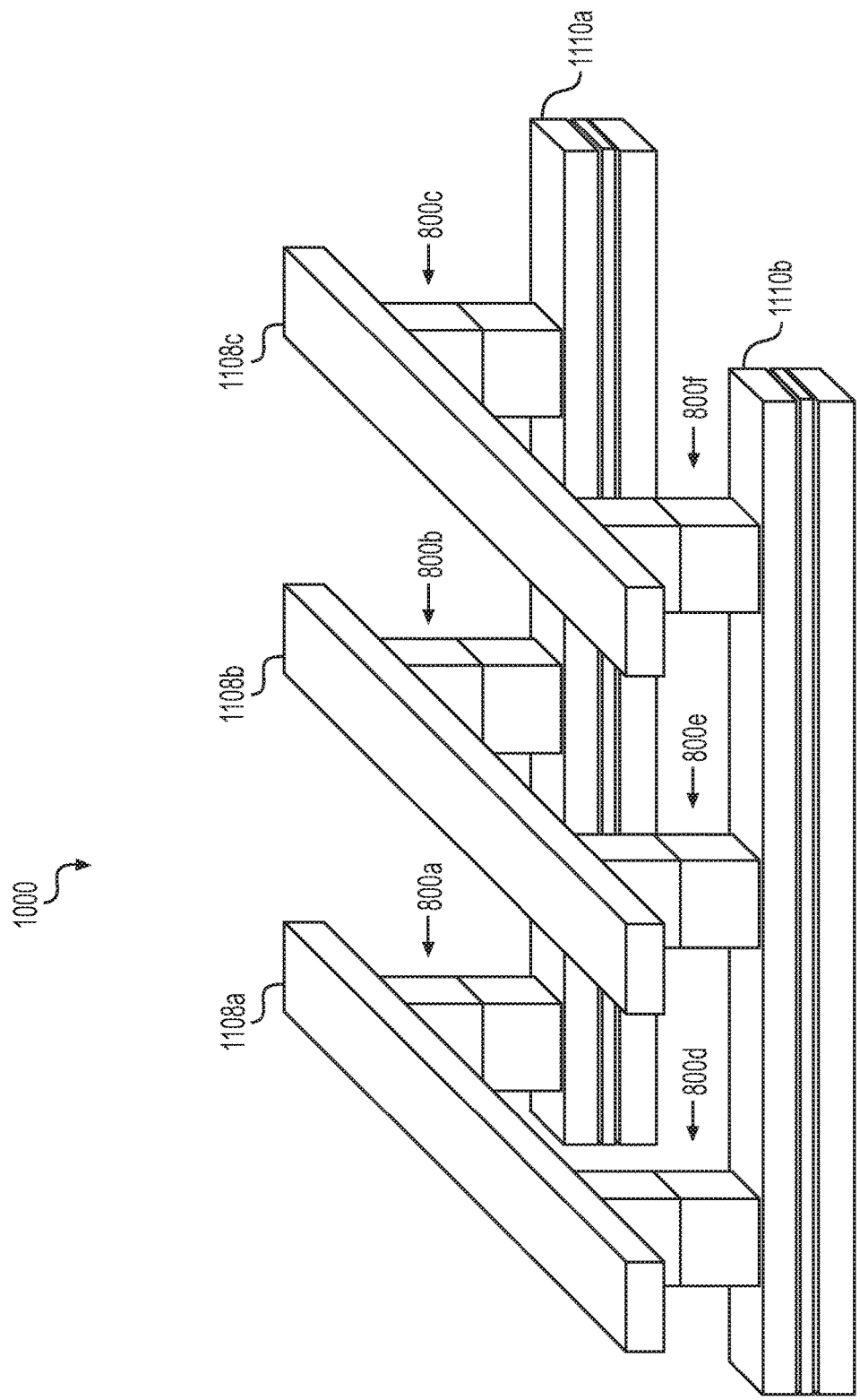
FIG. 11 illustrates a portion of a cross-point memory array fabricated using the memory element of FIG. 8.

FIG. 11 illustrates a portion of a cross-point memory array fabricated using the memory element 800 of FIG. 8. Referring to FIG. 11, the cross-point memory array 1100 includes six of the memory elements 800a,b,c,d,e,f. The metal contacts 808 of pairs of the memory elements 800 have been joined to form three bit lines 1108a,b,c. The metal lines 810 of the memory elements 800 have been joined crosswise to form two word lines 1110a,b. By manipulating voltages/currents in the bit lines 1108, and the word lines 1110, the thermal switches of the array 1100 may be used to perform memory operations upon the memory elements 800 in the array 1100.

Figure 12:
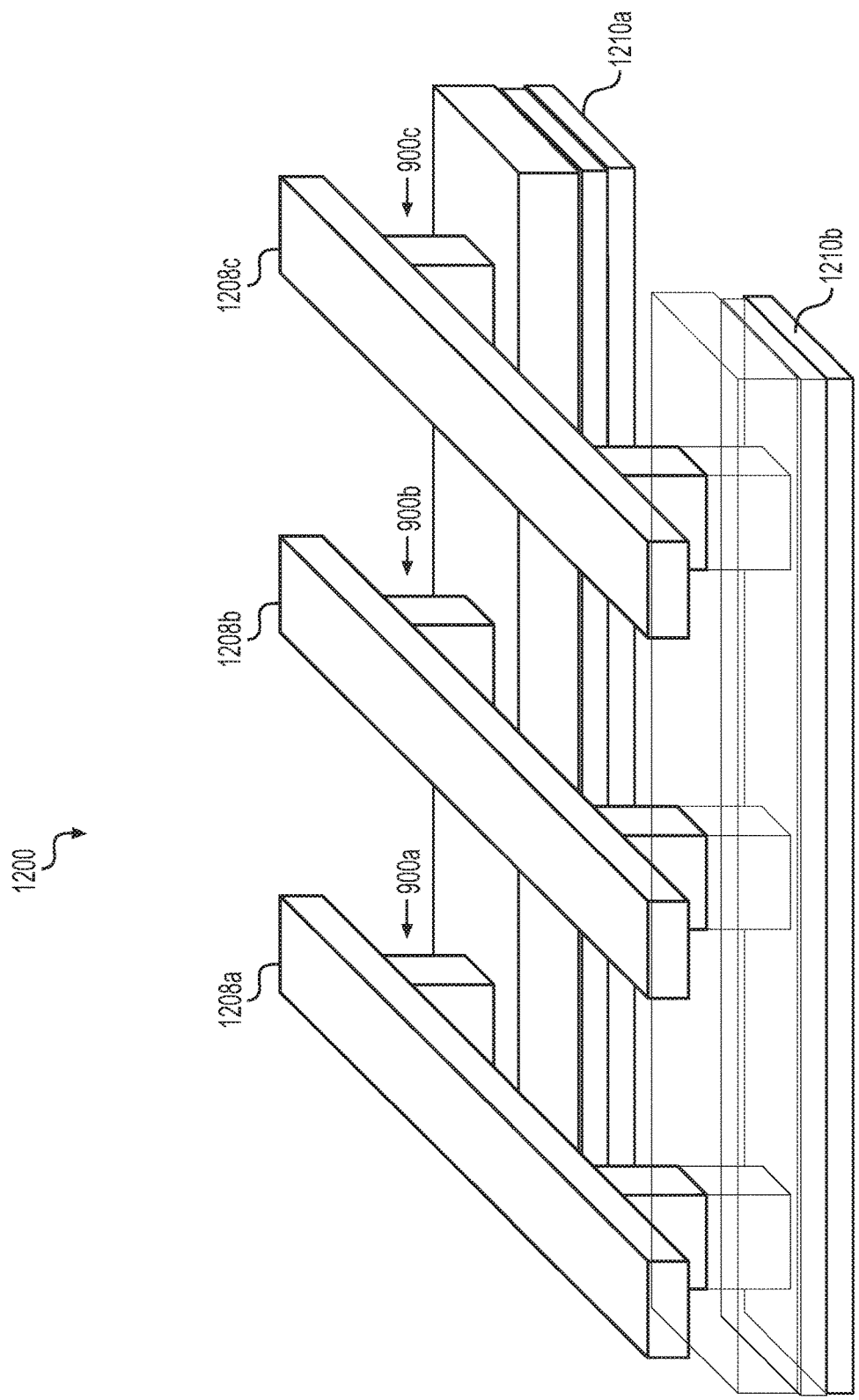
FIG. 12 illustrates a portion of the cross-point memory array fabricated using the memory element of FIG. 9.

FIG. 12 illustrates a portion of the cross-point memory array fabricated using the memory element 900 of FIG. 9. Referring to FIG. 12, the cross-point memory array 1200 includes six of the memory elements 900a,b,c,d,e,f. The metal contacts 908 of pairs of the memory elements 900 have been joined to form three bit lines 1208a,b,c. The metal lines 910 of the memory elements 900 have been joined crosswise to form two word lines 1210a,b. By manipulating voltages/currents in the bit lines 1208, and the word lines 1210, the thermal switches of the array 1200 may be used to perform memory operations upon the memory elements 900 in the array 1200.

Figure 13:
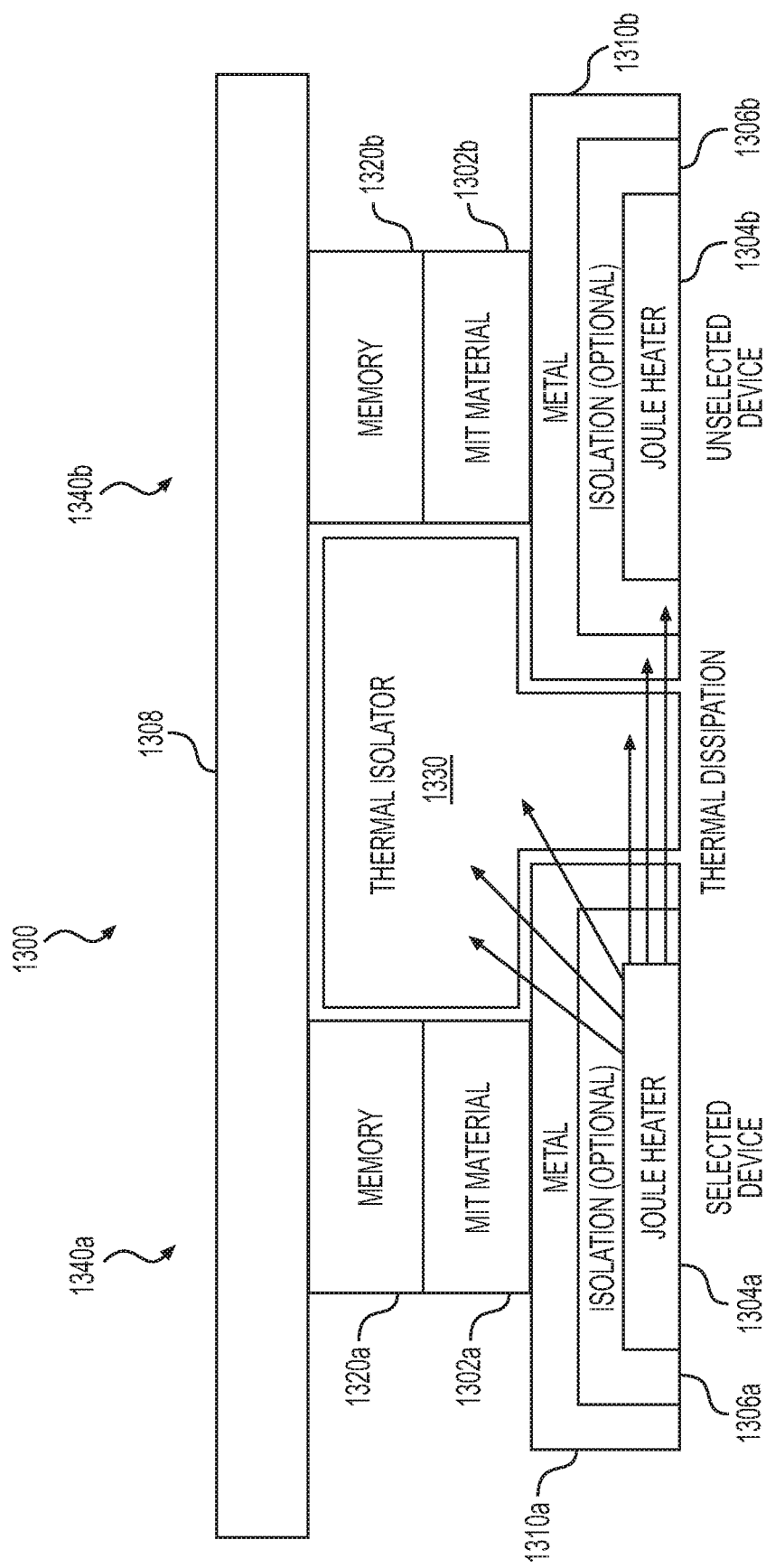
FIG. 13 illustrates the thermal field fringing effect.

In some embodiments of the disclosed memory arrays, thermal field fringing effects may occur. That is, the Joule heater of one memory element may affect one or more neighboring memory elements. FIG. 13 illustrates the thermal field fringing effect. Referring to FIG. 13, two memory elements 1340a,b are shown, connected by a bit line 1308. When the word line 1310a of the memory element 1340a is selected, the temperature of the Joule heater 1304a in that memory element 1340a rises. Without proper thermal isolation, the Joule heater 1304a in the selected word line 1310a may heat the MIT material 1302b in an unselected word line 1310b beyond its transition temperature, which may change the state of the associated memory 1320b unexpectedly, thereby introducing errors into the array 1300. To prevent this thermal fringing effect, thermal isolators 1330 having low thermal conductivity may be placed between memory elements 1340, as shown in FIG. 13. This arrangement prevents thermal field fringing effects, thereby improving the performance and reliability of the array 1300. The Joule heaters 1304a,b are disposed within the metal lines 1310a,b, respectively, and can be separated from the metal lines 1310a,b by adding isolators 1306a,b. However, the isolators 1306a,b are optional and not necessary, and so may be omitted or removed. If the isolators 1306a,b are omitted or removed, then each heater 1304a,b and its respective metal line 1310a,b may be combined by using the same piece of metal line.

In order to improve power efficiency, constriction techniques may be used to concentrate the Joule heat generation near the thermal switches. Due to current continuity, the constricted sections of the Joule heater will have a higher current density, and therefore a higher density of heat generation and a higher temperature. In this manner high temperatures are generated only at locations where they are needed. This technique also helps to control the thermal budget, and improve the reliability, of the integrated circuits in which the thermal switches are implemented.

Figure 14:
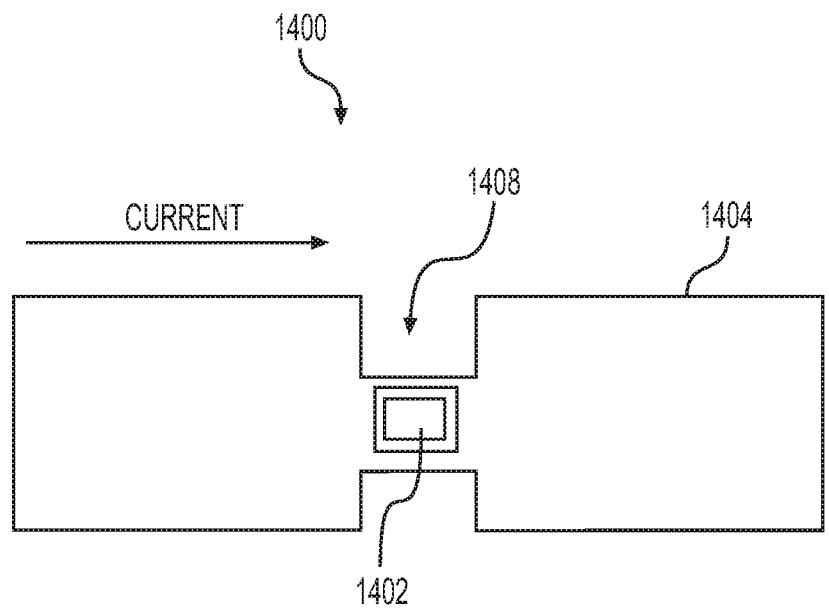
FIG. 14 illustrates a nanowire constriction technique.

FIG. 14 illustrates a nanowire constriction technique. Referring to FIG. 14, a nanowire 1404 is constricted at 1408 near MIT material 1402, thereby creating a Joule heater for the MIT material 1402.

Figure 15:
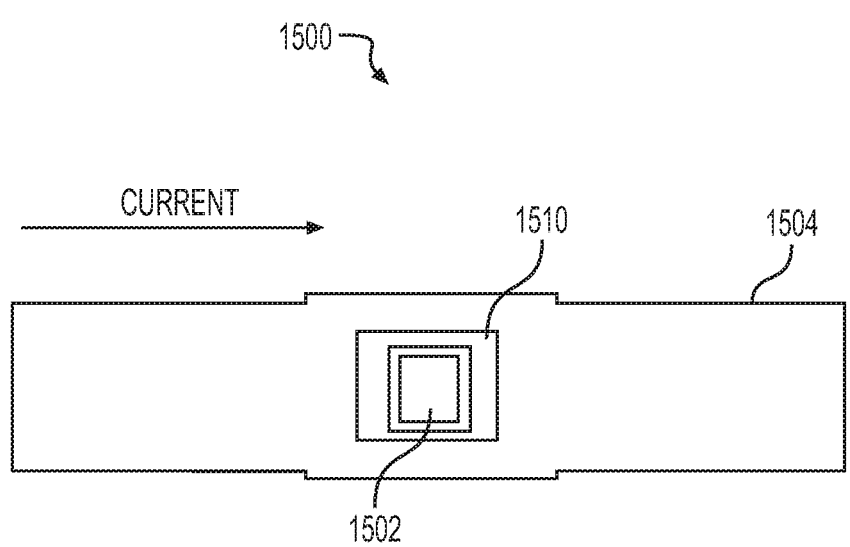
FIG. 15 illustrates a nanopore constriction technique.

FIG. 15 illustrates a nanopore constriction technique. Referring to FIG. 15, a nanopore 1510 is created within a nanowire near MIT material 1502, thereby creating a Joule heater for the MIT material 1502.

In addition to the described selectors for cross-point or 3D vertical memory arrays, the disclosed thermal switches have numerous other applications. For example, the disclosed thermal switches may be used for the high-temperature forming and cycling of resistive memory devices to achieve better overall performance.

The disclosed thermal switches may be used as on-chip heaters to enable the block erase of memory cells at high temperatures. Memories such as phase change memories and resistive memories are generally erased at a temperature of 100° C. Heaters implemented using the disclosed thermal switches may raise the temperature of such memories of to 400° C. or higher, ensuring they are erased. One application of this technology is for systems requiring secure self-destruction.

The disclosed thermal switches may be used as temperatures surge protectors for integrated circuits.

The disclosed thermal switches may be used as block activation and deactivation switches in integrated circuits, to achieve low power operation.

The disclosed thermal switches may be used as reliable optical switches in photonic circuits.

The disclosed thermal switches may be used in place of transistors in a thermal computing (phonon) system. The disclosed thermal switches are not limited to having a positive correlation between conductivity and temperature, and may also be used with thermal switches having a negative correlation to create complementary thermal logic circuits.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It will be appreciated that the present invention is not limited to the exact construction that has been described above and illustrated in the accompanying drawings, and that various modifications and changes can be made without departing from the scope thereof.

What is claimed is:

1. A memory device comprising:
   a memory; and
   a memory selector electrically coupled to the memory, wherein the memory selector comprises:
   a metal-insulator-transition (MIT) material, and
   a heater disposed near the MIT material, wherein the heater comprises a Joule heater, and wherein the Joule heater comprises at least one of a constriction in a nanowire or a nanopore in a nanowire.

2. The memory device of claim 1, further comprising:
   an electrical insulator disposed between the MIT material and the heater.

3. The memory device of claim 1, further comprising:
   first and second terminals electrically coupled to the Joule heater;

wherein the Joule heater generates heat when a current is passed though the Joule heater and the first and second terminals.

4. The memory device of claim 1, further comprising:
a first terminal electrically coupled to the MIT material; and
a second terminal electrically coupled to the memory;
wherein states of the MIT material are changed at the first and second terminals, wherein the states of the MIT material comprise a metal state and an insulator state; and
states of the memory are changed and sensed at the first and second terminals.

5. The memory device of claim 4, further comprising:
an electrical insulator disposed between the heater and the first terminal.

6. The memory device of claim 4, further comprising:
one or more electrical insulators disposed between the heater and at least one of the MIT material, the memory, the first terminal, or the second terminal.

7. A cross-point memory array, comprising:
an array of memory elements arranged in rows and columns, wherein each memory element in the array comprises:
a memory, and
a memory selector electrically coupled to the memory, wherein the memory selector comprises:
a metal-insulator-transition (MIT) material, and
a Joule heater disposed near the MIT material;
a plurality of thermal isolators disposed between the memory elements;
a plurality of first metal lines each electrically coupled to memory elements of the array in a respective column; and
a plurality of second metal lines each electrically coupled to memory elements of the array in a respective row.

8. The cross-point memory array of claim 7, wherein each of the memory elements further comprises:
an electrical insulator disposed between the Joule heater and the respective second metal line.

9. The cross-point memory array of claim 7, wherein each of the memory elements further comprises:
one or more electrical insulators disposed between the Joule heater and at least one of the MIT material, the memory, the respective first metal line, or the respective second metal line.

10. The cross-point memory array of claim 7, wherein each of the Joule heaters comprises at least one of:
a constriction in a nanowire; or
a nanopore in a nanowire.

* * * * *